(12) United States Patent
Sharma et al.

(10) Patent No.: US 11,107,507 B2
(45) Date of Patent: Aug. 31, 2021

(54) TRANSMITTING DATA SIGNALS ON SEPARATE LAYERS OF A MEMORY MODULE, AND RELATED METHODS, SYSTEMS AND APPARATUSES

(71) Applicant: Micron Technology, Inc., Boise, ID (US)

(72) Inventors: Yogesh Sharma, Boise, ID (US); Atsushi Morishima, Tokyo (JP); Yoshihisa Fukushima, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/448,541

(22) Filed: Jun. 21, 2019

(65) Prior Publication Data

US 2020/0402547 A1 Dec. 24, 2020

(51) Int. Cl.

| | |
|---|---|
| *G11C 5/06* | (2006.01) |
| *H05K 1/02* | (2006.01) |
| *G11C 7/10* | (2006.01) |
| *G11C 5/04* | (2006.01) |
| *G11C 11/4096* | (2006.01) |

(52) U.S. Cl.
CPC .............. *G11C 5/063* (2013.01); *G11C 5/04* (2013.01); *G11C 7/109* (2013.01); *G11C 7/1063* (2013.01); *G11C 11/4096* (2013.01); *H05K 1/0242* (2013.01); *H05K 2201/10159* (2013.01); *H05K 2201/10689* (2013.01)

(58) Field of Classification Search
CPC ......... G11C 5/063; G11C 5/04; G11C 7/1063; G11C 7/109; G11C 11/4096

USPC ........................................................ 365/63
See application file for complete search history.

(56) References Cited

U.S. PATENT DOCUMENTS

| | | | |
|---|---|---|---|
| 2006/0139983 A1* | 6/2006 | Sprietsma | H05K 1/181 |
| | | | 365/52 |
| 2007/0030814 A1* | 2/2007 | Shin | G11C 29/08 |
| | | | 370/241 |
| 2008/0151591 A1* | 6/2008 | Doran | G11C 5/04 |
| | | | 365/63 |
| 2010/0077267 A1* | 3/2010 | Perego | G11C 7/1072 |
| | | | 714/716 |
| 2014/0192583 A1* | 7/2014 | Rajan | G11C 5/06 |
| | | | 365/63 |
| 2017/0351627 A1* | 12/2017 | Ware | G11C 7/10 |
| 2018/0225235 A1* | 8/2018 | Lee | G06F 11/1044 |

* cited by examiner

*Primary Examiner* — Sung Il Cho
(74) *Attorney, Agent, or Firm* — TraskBritt

(57) ABSTRACT

Systems, apparatuses, and methods for routing and transmitting signals in an electronic device are described. Various signal paths may be routed to avoid or limit reference transitions or transitions between layers of a structure of a device (e.g., printed circuit board (PCB)). In a memory module, for example, different data inputs/outputs (e.g., DQs) may be routed through different layers of a PCB according to their relative location to one another. For instance, DQs associated with even bits of a byte may be routed on one layer of a PCB near one ground plane, and DQs associated with odd bits of the byte may be routed on a different layer of the PCB near another ground plane. Each of the DQs may be subject to a single reference layer change, which may occur at or near a DRAM of a memory module (e.g., in the DRAM ball grid array (BGA) area).

20 Claims, 7 Drawing Sheets

400 transmit a first set of data signals associated with a memory access on a first signal layer of a PCB of a dual-rank DIMM to or from a first memory device of the dual-rank DIMM
410 transmit a second set of data signals associated with the memory access on a second signal layer of the PCB of the dual-rank DIMM to or from the first memory device of the dual-rank DIMM
420

TRANSMITTING DATA SIGNALS ON SEPARATE LAYERS OF A MEMORY MODULE, AND RELATED METHODS, SYSTEMS AND APPARATUSES

TECHNICAL FIELD

Embodiments of the disclosure relate to data signal routing (or transmitting), and more specifically, to routing data signals on separate layers of a memory module (rather than on the same layer). Yet more specifically, some embodiments relate to methods and apparatuses for such routing, and related memory modules, memory devices, semiconductor devices, and systems.

BACKGROUND

A dual in-line memory module (DIMM) is a module that contains multiple random access memory (RAM) chips on a substrate, which may be characterized as a circuit board. The DIMM circuit board includes a number of pins that connect the RAM chips and associated logic (i.e., memory controller) of the DIMM to a computer motherboard.

DIMMs are classified by ranks. A rank is an area or block of data (e.g., 64-bits). For example, a single-rank DIMM uses its dynamic RAM (DRAM) chips to create a single block of 64-bits, and each of the chips is activated by one chip-select (CS) signal from a memory controller. A dual-rank DIMM includes two blocks of data (e.g., two blocks of 64-bits) from two sets of chips on the DIMM, and uses two chip-select signals. In a dual-rank DIMM, a first block (e.g., rank 0) is located on a first side of the DIMM and a second block (e.g., rank 1) is located on an opposite, second side of the DIMM.

Conventional DIMM construction or design may not account for or attempt to avoid signal quality issues associated with transitions between layers of the DIMM device.

DETAILED DESCRIPTION

As described above, in convention dual-rank DIMMs, data signals are routed (or transmitted) to a single memory chip along a single layer in the DIMM based on conventional data signal routing rules. For example, even DQ bits are routed along a layer of a dual-rank DIMM to a memory chip and odd DQ bits are routed along the same layer to the same memory chip. The data signals have different paths to the same memory chip, for example, even DQ bits are received at a top input layer of the DIMM and odd DQ bits are received at a bottom input layer of the DIMM. By routing the data signals (e.g., even/odd DQ bits) along the same layer in the DIMM, the data signals arrive at the memory chip at the same time (within picoseconds from one another). However, such routing of the data signals along the same layer requires numerous reference changes that negatively affect the data signaling performance.

In various embodiments described herein, data signals (e.g., even/odd DQ bits) are routed to the same memory chip of a memory module (e.g., a dual-rank DIMM) along different layers of the memory module (e.g., different data signal (DQ) layers). For example, even DQ bits are routed along a first layer of the memory module and odd DQ bits are routed along a different, second layer of the memory module. Accordingly, the number of reference changes are reduced which improves the signal performance of the data signal.

Additionally, a memory controller may cause data signals that travel along different path (e.g., along different layers) to arrive at a memory chip at substantially the same time. For example, a memory controller may be trained to enable the data signals to travel along different path (e.g., along different layers) and arrive at the same memory chip at the same time. Alternatively, in one embodiment, the routing/transmitting is a function of a circuitry configuration of a DIMM and a memory controller interacts with the DIMM without concern for how the signals are transferred between the bus and the DRAMs. It should be appreciated that the terms "routing" and "transmitting," as provided herein, are interchangeable. In general, the terms "routing" and "transmitting" describe the passing of data signals through one or more layers of a memory module (e.g., DIMM).

The term "reference change," as provided herein, is defined as a change in reference from a first ground layer of a memory module (e.g., DIMM) to a different, second ground layer of the memory module. Such ground layers may also be referred to as ground planes and may be located within or may occupy a layer or layers or a printed circuit board (PCB). Layers of a PCB may include overlay, solder, signal, dielectric, ground, or the like, and each layer or each type of layer may be made of different materials or different combinations of materials relative to other layers or other types of layers.

Figure 1:
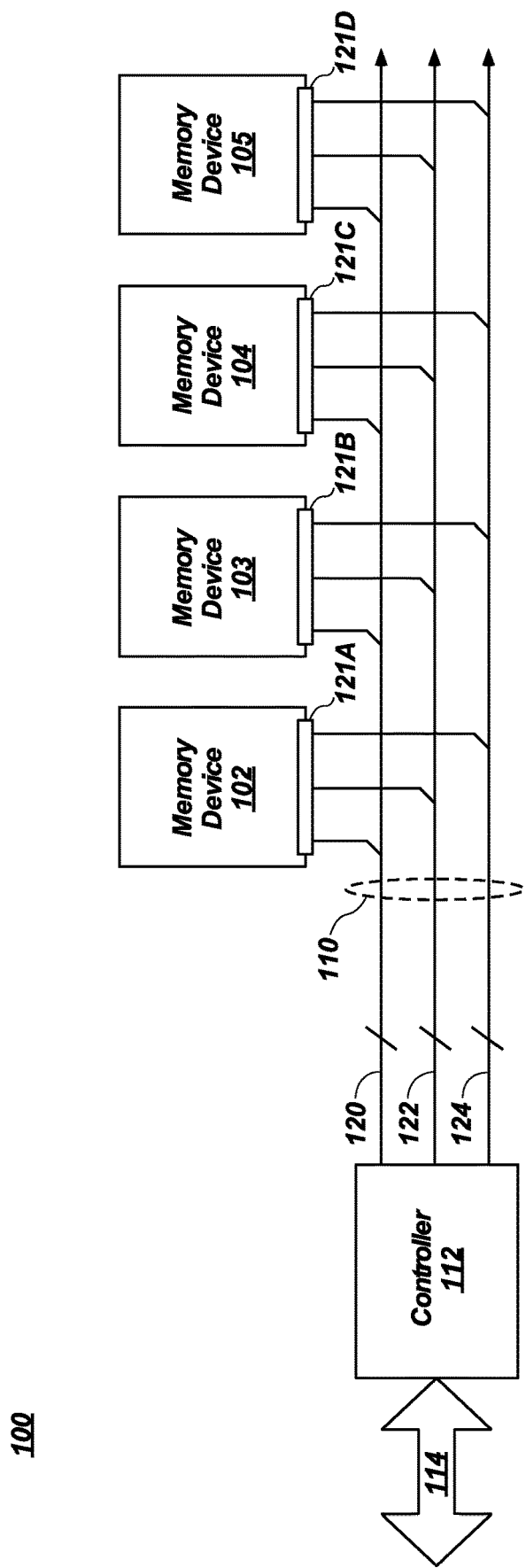
FIG. 1 is a block diagram of a memory system including a number of memory devices, in accordance with various embodiments of the present disclosure.

FIG. 1 illustrates a memory system 100, according to various embodiments of the present disclosure. Memory system 100 includes a number of memory devices 102, 103, 104 and 105 coupled to a communication bus 110 (e.g., a system bus). Each memory device 102-105 may include one or more memory die, and collectively, memory devices 102-105 may be referred to as a memory module (e.g., a dual in-line memory module (DIMM)), a multi-chip package (MCP) or a package on package (POP).

Memory system 100 further includes a controller 112 coupled to each memory device 102-105 via communication bus 110. Controller 112, which may include a processor or any other suitable type of controller, may be configured to control and/or regulate various operations of memory system 100, as well as provide interactivity with another device or system coupled to memory system 100 via an interface 114.

Communication bus 110 may include one or more of an address bus 120, a data bus 122, and a control signal bus 124. In some embodiments, memory devices 102-105, communication bus 110, and controller 112 may be configured (e.g., physically arranged and mounted) on a printed circuit board (PCB). In various embodiments, memory system 100 may include a DIMM and one or more memory devices 102-105 may be a rank (or a number of ranks) of the DIMM.

According to some embodiments of the present disclosure, at least some of memory devices 102-105 may be coupled to communication bus 110 via an associated interface 121A-121D (referred to collectively as interface 121). For example, interface 121 (any one of interface 121A-121D) may include one or more nodes (e.g., input/output (I/O) nodes) for coupling signal lines of an associated memory device to respective signal lines of communication bus 110. Further, interface 121 may include one or more nodes coupled to one or more power supplies (not shown in FIG. 1), such as, for example, power and/or reference potentials. For example, each interface 121 may include an electromechanical type connection or soldered lead connections to communication bus 110.

A memory device (e.g., memory device 102) may be in an active mode in response to the memory device being selected to drive data bus 122 to a particular state, such as in response to performing a read operation in the memory device. Further, the memory device (e.g., memory device 102) may be in an inactive mode when another memory device (e.g., memory device 104) is selected to drive data bus 122 to a particular state, such as in response to performing a read operation in the other memory device (e.g., memory device 104).

Figure 2:
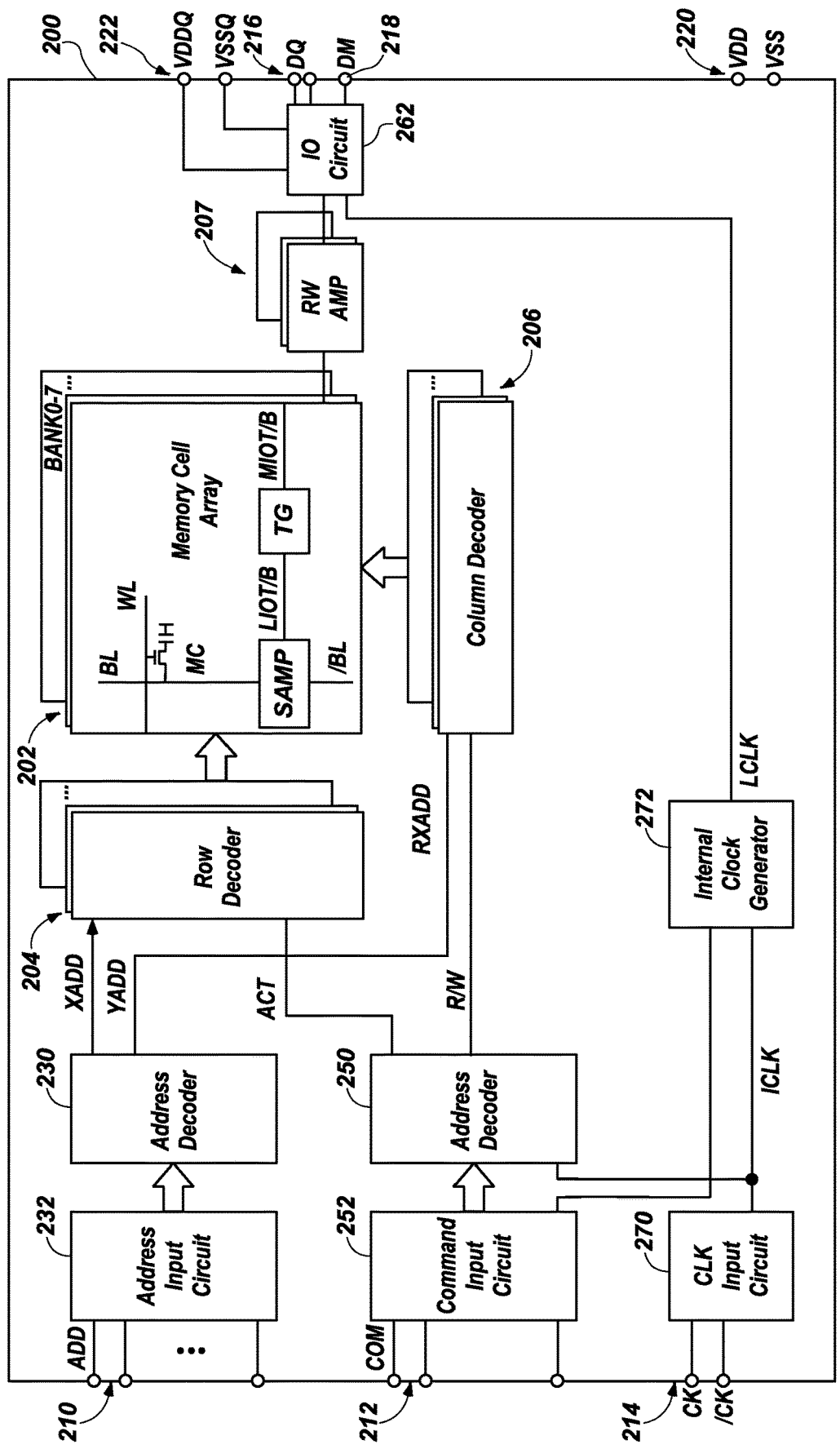
FIG. 2 is a block diagram of a memory device, according to various embodiments of the present disclosure, in accordance with various embodiments of the present disclosure.

FIG. 2 illustrates a memory device 200, according to various embodiments of the present disclosure. Memory device 200, which may include, for example, a DRAM (dynamic random access memory), a SRAM (static random access memory), a SDRAM (synchronous dynamic random access memory), a DDR SDRAM (double data rate DRAM, such as a DDR4 SDRAM and the like), or a SGRAM (synchronous graphics random access memory), may be part of memory system 100 of FIG. 1. For example, memory device 200 may include one of memory devices 102-105 of FIG. 1. Memory device 200, which may be integrated on a semiconductor chip, may include a memory array 202.

In the embodiment of FIG. 2, memory array 202 is shown as including eight memory banks BANK0-7. More or fewer banks may be included in memory array 202 of other embodiments. Each memory bank includes a number of word lines WL, a number of bit lines BL and /BL, and a number of memory cells MC arranged at intersections of the number of word lines WL and the number of bit lines BL and /BL. The selection of a word line WL may be performed by a row decoder 204 and the selection of the bit lines BL and /BL may be performed by a column decoder 206. In the embodiment of FIG. 1, row decoder 204 may include a respective row decoder for each memory bank BANK0-7, and column decoder 206 may include a respective column decoder for each memory bank BANK0-7.

Bit lines BL and /BL are coupled to a respective sense amplifier SAMP. Read data from bit line BL or /BL may be amplified by sense amplifier SAMP, and transferred to read/write amplifiers 207 over complementary local data lines (LIOT/B), transfer gate (TG), and complementary main data lines (MIOT/B). Conversely, write data outputted from read/write amplifiers 207 may be transferred to sense amplifier SAMP over complementary main data lines MIOT/B, transfer gate TG, and complementary local data lines LIOT/B, and written in memory cell MC coupled to bit line BL or /BL.

Memory device 200 may be generally configured to be receive various inputs (e.g., from an external controller) via various terminals, such as address terminals 210, command terminals 212, clock terminals 214, data terminals 216, and data mask terminals 218. Memory device 200 may include additional terminals such as power supply terminals 220 and 222.

During a contemplated operation, one or more command signals COM, received via command terminals 212, may be conveyed to a command decoder 250 via a command input circuit 252. Command decoder 250 may include a circuit configured to generate various internal commands via decoding one or more command signals COM. Examples of the internal commands include an active signal ACT and a read/write signal R/W.

Further, one or more address signals ADD, received via address terminals 210, may be conveyed to an address decoder 230 via an address input circuit 232. Address decoder 230 may be configured to supply a row address XADD to row decoder 204 and a column address YADD to column decoder 206.

Active signal ACT may include a pulse signal that is activated in response to a command signal COM indicating row access (e.g., an active command). In response to active signal ACT, row decoder 204 of a specified bank address may be activated. As a result, the word line WL specified by row address XADD may be selected and activated.

Read/write signal R/W may include a pulse signal that is activated in response to a command signal COM indicating column access (e.g., a read command or a write command). In response to read/write signal R/W, column decoder 206 may be activated, and the bit line BL specified by column address YADD may be selected.

In response to active signal ACT, a read signal, a row address XADD, and a column address YADD, data may be read from memory cell MC specified by row address XADD and column address YADD. The read data may be output via a sense amplifier SAMP, a transfer gate TG, read/write amplifier 207, an input/output circuit 262, and data terminal 216. Further, in response to active signal ACT, a write signal, a row address XADD, and a column address YADD, write data may be supplied to memory array 202 via data terminal 216, input/output circuit 262, read/write amplifier 207, transfer gate TG, and sense amplifier SAMP. The write data may be written to memory cell MC specified by row address XADD and column address YADD.

Clock signals CK and /CK may be received via clock terminals 214. A clock input circuit 270 may generate internal clock signals ICLK based on clock signals CK and ICK. Internal clock signals ICLK may be conveyed to various components of memory device 200, such as command decoder 250 and an internal clock generator 272. Internal clock generator 272 may generate internal clock signals LCLK, which may be conveyed to input/output circuit 262 (e.g., for controlling the operation timing of input/output circuit 262). Further, data mask terminals 218 may receive one or more data mask signals DM. When data mask signal DM is activated, overwrite of corresponding data may be prohibited.

Figure 3A:
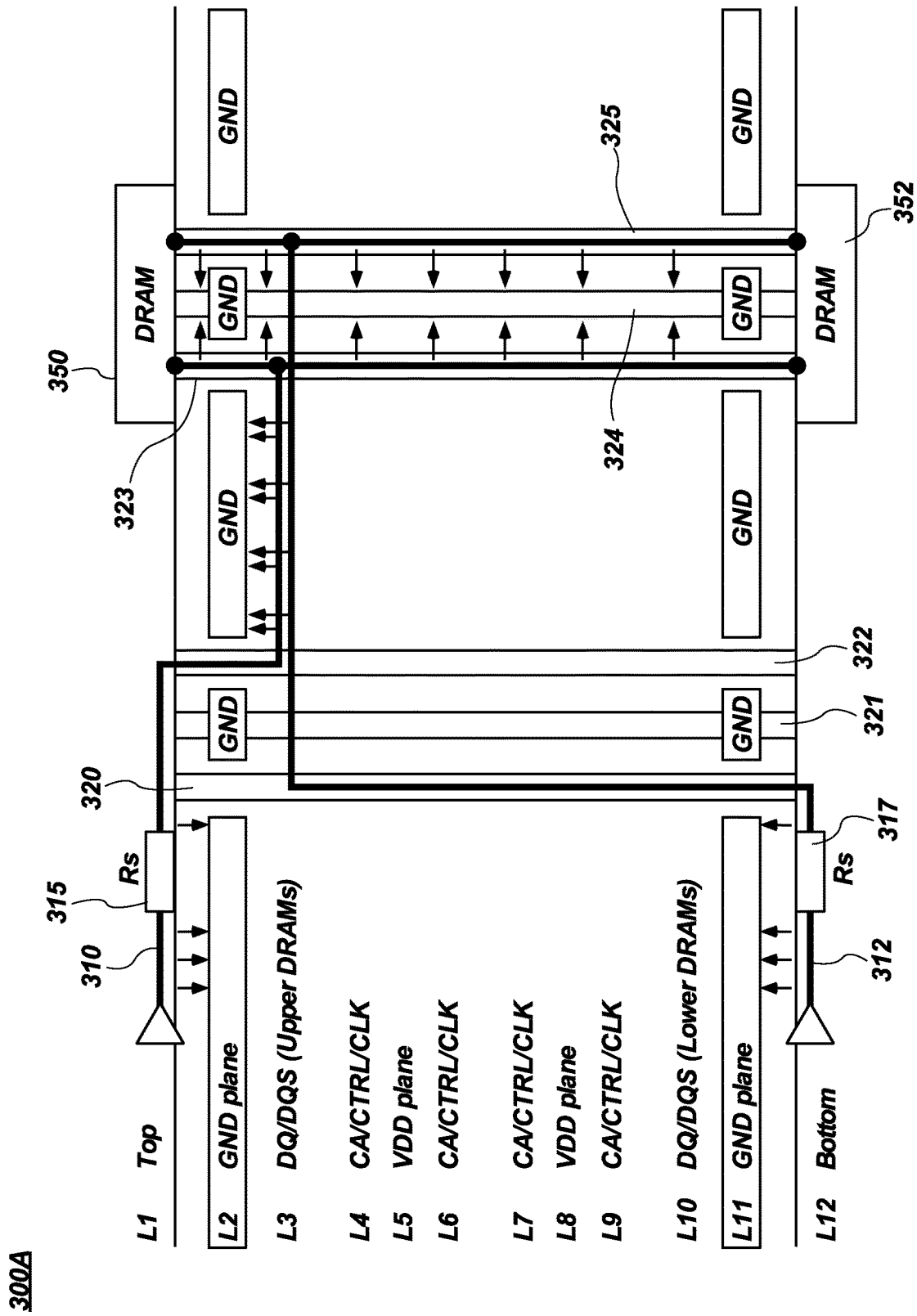
FIG. 3A is a block diagram of a conventional data signal routing scheme for a DIMM.

FIG. 3A is a diagram of a conventional data signal routing scheme through a dual-rank DIMM 300A. DIMM 300A is a twelve layer DIMM. For example, DIMM 300A includes layers L1-L12. Layer 1 (L1) is a top layer, layer 2 (L2) is a GND layer, layer 3 (L3) is a DQ/DQS layer, layer 4 (L4) is a CA/CTRL/CLK layer, layer 5 (L5) is a VDD plane layer, layer 6 (L6) is a CA/CTRL/CLK layer, layer 7 (L7) is a CA/CTRL/CLK layer, layer 8 (L8) is a VDD plane layer, layer 9 (L9) is a CA/CTRL/CLK layer, layer 10 (L10) is a DQ/DQS (Lower DRAMs) layer, layer 11 (L11) is a GND layer, and layer 12 (L12) is a bottom layer.

As described above, in a conventional data routing scheme (for example in a dual-rank DIMM), data signals are routed to a memory chip along a single layer in the DIMM. In a conventional data routing scheme, in response to a write operation, a memory controller (not shown) transmits data signals to top layer L1, and bottom layer L12 for routing to memory device 350 (e.g., rank 0 of a DDR4 DIMM). For example, data signals 310 (e.g., even DQ bits of data) are received at top layer L1 (e.g., a data input layer) and are routed through series resistor 315 (in layer L1) and then to layer L3 (e.g., a data signal (DQ) routing layer) by way of via 322. Data signals 310 are then routed from layer L3 to memory device 350 by way of via 323. In this example, data signals 310 do not experience a reference change because data signals 310 are referenced to layer L2 (GND layer) while being routed from layer L1 to memory device 350.

Continuing with the example above, data signals 312 (e.g., odd DQ bits of the data) are received at bottom layer L12 (e.g., data input layer). Data signals 312 and data signals 310 are concurrently received at DIMM 300A. Data signals 312 are routed through series resistor 317 (in layer L12) and then to layer L3 by way of via 320. Data signals 312 are then routed from layer L3 to memory device 350 through via 325. In this example, data signals 312 experience one reference change because data signals 312 are initially referenced (e.g., upon receipt at DIMM 300A) to a first GND layer (layer L11) and then change reference to a second GND layer (layer L2). It should be appreciated, that the term "concurrent" as described herein, in various embodiments, refers to signals arriving the same time (e.g., at a memory chip), or about the same time due to, for example, latency.

In another example, in a conventional data routing scheme, in response to a write operation, a memory controller (not shown) routes data signals to memory device 352 (e.g., rank 1 of a DDR4 DIMM). In such an example, data signals 310 (e.g., even DQ bits of data) are received at top layer L1 and are routed through series resistor 315 (in layer L1) and then to layer L3 through via 322. Data signals 310 are then routed from layer L3 to memory device 352 through via 323. In this example, data signals 310 experience one reference change because data signals 310 are initially referenced (e.g., upon receipt at DIMM 300A) to a first GND layer (layer L2) and then change reference to a second GND layer (layer L11) while being routed from layer L1 to memory device 352.

Continuing with the example above, data signals 312 (e.g., odd DQ bits of the data) are received at bottom layer L12 (e.g., a data input layer). Data signals 312 and data signals 310 are concurrently received at DIMM 300A. Data signals 312 are routed through series resistor 317 (in layer L12) and then to layer L3 through via 320. Data signals 312 are then routed from layer L3 to memory device 352 through via 325. In this example, data signals 312 experience two reference changes. Data signals 312 experience a first reference change from GND layer (layer L11) to GND layer (layer L2) (e.g., near series termination). Data signals 312 experience a second reference change from GND layer at layer L2 to GND layer at layer L11 (e.g., proximate a DRAM ball grid array—not shown) when data signals 312 are routed from layer L3 to memory device 352.

Figure 3B:
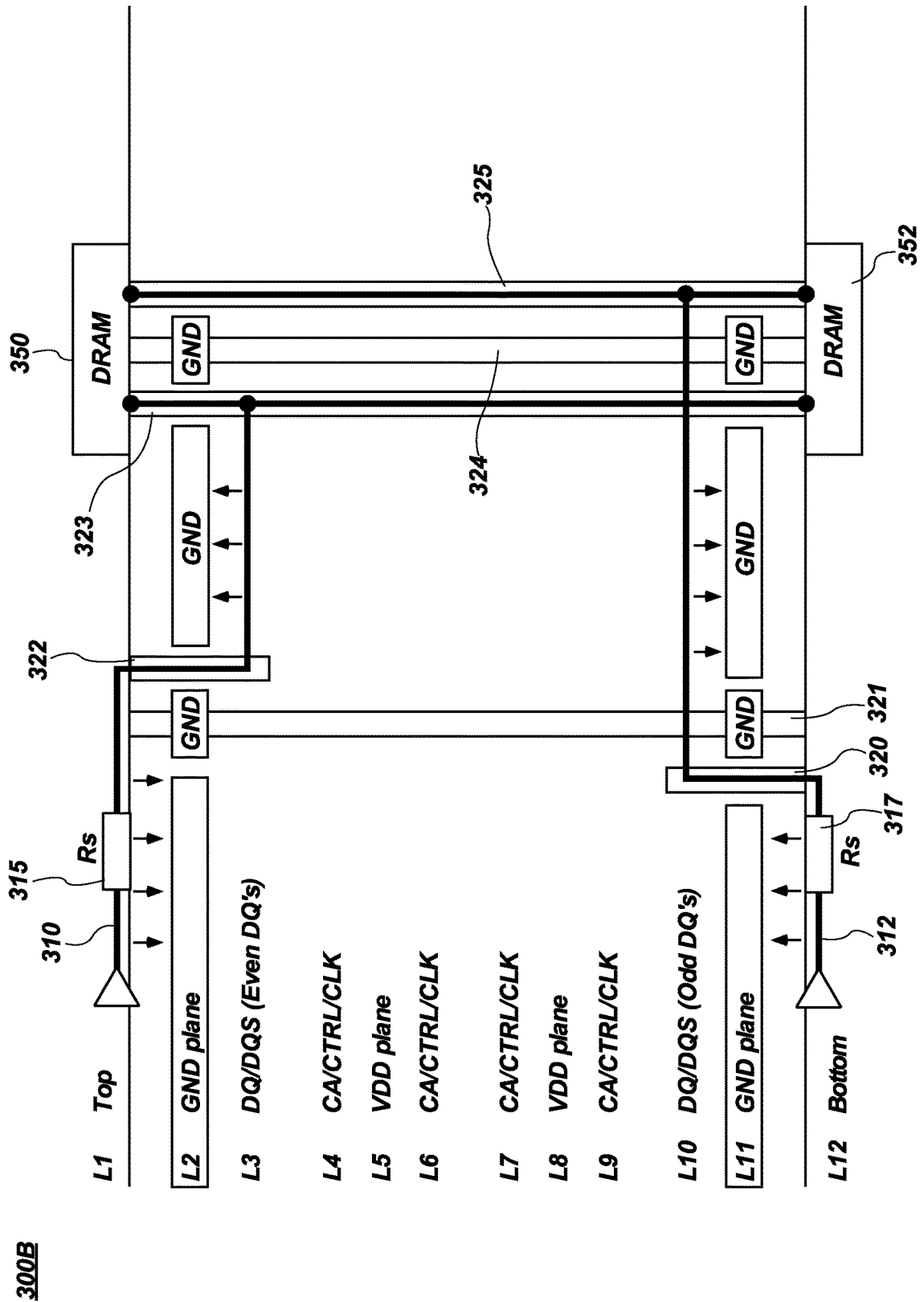
FIG. 3B is a block diagram of a data signal routing scheme for a memory module, in accordance with various embodiments of the present disclosure.

FIG. 3B is a diagram of a data signal routing scheme through a memory module 300B, according to various embodiments described herein. As a non-limiting example, memory module 300B may include a DIMM. A data signal routing scheme described with respect to memory module 300B reduces the number of reference changes compared to conventional modules. In particular, data signals are routed on different layers (rather than the same layer). By reducing the number of reference changes, performance of the data signals are improved.

As depicted in FIG. 3B, memory module 300B is a twelve layer memory module (similar to DIMM 300A). For example, memory module 300B includes layers L1-L12. Layer 1 (L1) is a top layer, layer 2 (L2) is a GND layer, layer 3 (L3) is a DQ/DQS layer, layer 4 (L4) is a CA/CTRL/CLK layer, layer 5 (L5) is a VDD plane layer, layer 6 (L6) is a CA/CTRL/CLK layer, layer 7 (L7) is a CA/CTRL/CLK layer, layer 8 (L8) is a VDD plane layer, layer 9 (L9) is a CA/CTRL/CLK layer, layer 10 (L10) is a DQ/DQS layer, layer 11 (L11) is a GND layer, and layer 12 (L12) is a bottom layer. In various embodiments, DIMM 300B can have more or less than 12 layers. For example, DIMM 300B may be a 14 layer DIMM.

As depicted, memory module 300B includes a dual-rank memory module (e.g., a dual-rank DIMM). For example, memory module 300B may include a DDR4-SDRAM DIMM, where memory device 350 is a first rank (e.g., rank 0) and memory device 352 is a second rank (e.g., rank 1). It should be appreciated that memory module 300B can be, but is not limited to, a single-rank DIMM or a quad-rank DIMM.

Still referring to FIG. 3B, in response to a write operation, a memory controller (e.g., DDR4 memory controller—not shown) transmits data signals via top layer L1 and bottom layer L12 for routing to memory device 350 (e.g., rank 0 of a DDR4 DIMM). For example, data signals 310 (e.g., even DQ bits of data) are transmitted to and received at top layer L1. Data signals 310 are then routed through series resistor 315 (in layer L1) and then to layer L3 through via 322. It is noted that, according to some embodiments, via 322 extends from layer L1 to layer L3 (rather than from layer L1 to layer L12, as depicted in FIG. 3A). Data signals 310 are then routed from layer L3 to memory device 350 through via 323. In this example, data signals 310 do not experience a reference change because data signals 310 are referenced to layer L2 (GND layer) while being routed from layer L1 to layer L3 and to memory device 350.

Continuing with the example above, data signals 312 (e.g., odd DQ bits of the data) are received via bottom layer L12 (e.g., data input layer). Data signals 312 and data signals 310 are concurrently received at memory module 300B. Data signals 312 are routed through series resistor 317 (in layer L12) and then to layer L10 through via 320. It is noted that, according to some embodiments, via 320 in FIG. 3B extends from layer L12 to layer L10 (rather than from layer L12 to layer L1, as depicted in FIG. 3A). Data signals 312 are then routed from layer L10 to memory device 350 through via 325. In this example, data signals 312 experience one reference change because data signals 312 are initially referenced (e.g., upon receipt at memory module 300B) to a first GND layer (layer L11) and then change reference to a second GND layer (layer L2) when routed to memory device 350.

In another example, in response to a write operation, a memory controller (not shown) routes data signals to memory device 352 (e.g., rank 1 of a DDR4 DIMM). In such an example, data signals 310 (e.g., even DQ bits of data) are received at top layer L1 and are routed through series resistor 315 (in layer L1) and then to layer L3 through via 322. Data signals 310 are then routed from layer L3 to memory device 352 through via 323. In this example, data signals 310 experience one reference change from GND layer (layer L2) to GND layer (layer L11) while being routed from layer L1 to layer L3 to memory device 352.

Continuing with the example above, data signals 312 (e.g., odd DQ bits of the data) are received at bottom layer L12. Data signals 312 and data signals 310 are concurrently received at memory module 300B. Data signals 312 are routed through series resistor 317 (in layer L12) and then to layer L10 through via 320. Data signals 312 are then routed from layer L10 to memory device 352 through via 325. In this example, data signals 312 do not experience a reference change because data signals 312 remain referenced to GND layer (layer L11) when routed from layer L12 to layer L10 to memory device 352. In one embodiment, GND layer at L11 and GND layer L2 are at common ground by way of GND via 321 and GND via 324.

With reference again to DIMM 300A of FIG. 3A, transmitting data from layer L1 to memory device 350 does not require a reference change, and transmitting data from layer L12 to memory device 350 requires one reference change. Further, transmitting data from layer L12 to memory device 352 requires one reference change, and transmitting data from layer L12 to memory device 352 requires two reference changes. In contrast, with reference to memory module 300B of FIG. 3B, transmitting data from layer L1 to memory device 350 does not require a reference change, and transmitting data from layer L12 to memory device 350 requires one reference change. Further, transmitting data from layer L12 to memory device 352 requires one reference change, and transmitting data from layer L12 to memory device 352 does not require a reference change. Thus, compared to DIMM 300A, a number of reference changes required in memory module 300B is reduced, and thus signal quality may be increased.

Referring to at least FIG. 3B, a memory controller (e.g., memory controller 112) controls, at least in part, routing of data signals through DIMM 300B. A memory controller, in various embodiments, is a DDR4 memory controller. In various embodiments, the memory controller enables data signals 310 and 312 to be concurrently routed on different layers (e.g., layer L3 and layer L10) by eliminating timing differences between the data signals 310 and 312 as they are routed through different layers of the DIMM. It should be appreciated that the memory controller is able to eliminate the timing differences by training of the memory controller and/or implementing various routing algorithms.

In various embodiments, data signals 310 and data signals 312 are data signals for a byte/nibble of data. For example, data signals 310 are even DQ bits (e.g., D0, D2, D4) of a byte (or nibble) of data and data signals 312 are odd DQ bits (e.g., D1, D3, D5) of the byte (or the nibble). Accordingly, data signals 310 can be referred to as a first subset (e.g., even DQ bits) of a byte/nibble of data, and data signals 312 can be referred to as s second subset (e.g., odd DQ bits) of the byte/nibble of data.

As described above, the routing schemes described with respect to FIGS. 3A and 3B are directed to writing data to DRAM. The routing schemes may also apply to read operations. The routing of read operations follow the opposite routing path as described for a respective write operation. For example, data signals 310 read from memory device 350 are routed on a reverse path of routing data signals 310 to memory device 350.

Additionally, a number of reference changes for routing data signals during a read operation is the same number of reference changes during routing of a respective write operation. For example, as described above, data signals 310 experiences one reference change when routed to memory device 352. Similarly, data signals 310 also experiences one reference change when routed from memory device 352 to layer L1 during a read operation.

Still referring to FIG. 3B, data signals 310 and 312 are routed on separate layers of DIMM 300B. For example, data signals 310 are routed on layer L3 (either to memory device 350 or memory device 352) while data signals 312 are routed on layer L10 (either to memory device 350 or memory device 352). The layer of DIMM 300B for routing of data signal 310 can be referred to as a top minus 2 layer (or top layer−2). That is, layer L3 is located two layers below top layer L1. In other words, the L3 layer is within two layers of top layer L1. Similarly, the layer of DIMM 300B for routing of data signals 312 can be referred to as N minus 2 layer (or N−2 layer). That is, DIMM 300B includes twelve layers (or N layers) and layer L10 is two layers above bottom layer L12. In other words, the L10 layer is within two layers of bottom layer L12. Accordingly, if DIMM 300B was as 14 layer DIMM, data signals 310 would be routed on the top−2 layer (e.g., a third layer of the 14 layers) and data signals 312 would be routed on a N−2 layer (e.g., a twelfth layer of the 14 layers).

Figure 4:
FIG. 4 is a flowchart illustrating an example method of transmitting data signals within a memory module, in accordance with various embodiments of the present disclosure.

FIG. 4 is a flowchart of an example method 400 for transmitting (or routing) data signals through separate layers on a DIMM. Method 400 may be arranged in accordance with at least one embodiment described in the present disclosure. Method 400 may be performed, in some embodiments, by a device or system, such as memory system 100 of FIG. 1, DIMM 300B of FIG. 3B, or another device or system. Although illustrated as discrete blocks, various blocks may be divided into additional blocks, combined into fewer blocks, or eliminated, depending on the desired implementation.

At block 410, a first set of data signals associated with a memory access are transmitted on a first signal layer of a printed circuit board (PCB) of a dual-rank dual in-line memory module (DIMM) to or from a first memory device of the dual-rank DIMM. For example, referring to FIG. 3B, a memory controller transmits even data signal 310 (e.g., even DQ bits) of a byte of data on layer L3 (DQ/DQS layer) to memory device 350. More specifically, a memory controller transmits the even data signal bits to memory device 350.

At block 420, a second set of data signals associated with the memory access are transmitted on a second signal layer of the PCB of the dual-rank DIMM to or from the first memory device of the dual-rank DIMM. For example, referring to FIG. 3B, a memory controller transmits odd data signal 312 (e.g., odd DQ bits) of a byte of data on layer L10 (DQ/DQS layer) to memory device 350. More specifically, a memory controller transmits the odd data signal bits to memory device 350.

In various embodiments, transmitting of data signals 310 on the first layer is concurrent with the transmitting of data signals 312 on the second layer. That is, a memory controller eliminates timing differences of data signals 310 and 312 during transmitting on separate respective layers to a single memory cell.

Modifications, additions, or omissions may be made to method 400 without departing from the scope of the present disclosure. For example, the operations of method 400 may be implemented in differing order. Furthermore, the outlined operations and actions are only provided as examples, and some of the operations and actions may be optional, combined into fewer operations and actions, or expanded into additional operations and actions without detracting from the essence of the disclosed embodiment. For example, in various embodiments, a memory controller routes data signals on separate layers during a read operation.

A semiconductor device is also disclosed. The semiconductor device, which may include a memory device, may include one or more arrays (e.g., memory arrays). The semiconductor device may also include an output device including one or more output driver circuits, as described herein.

Figure 5:
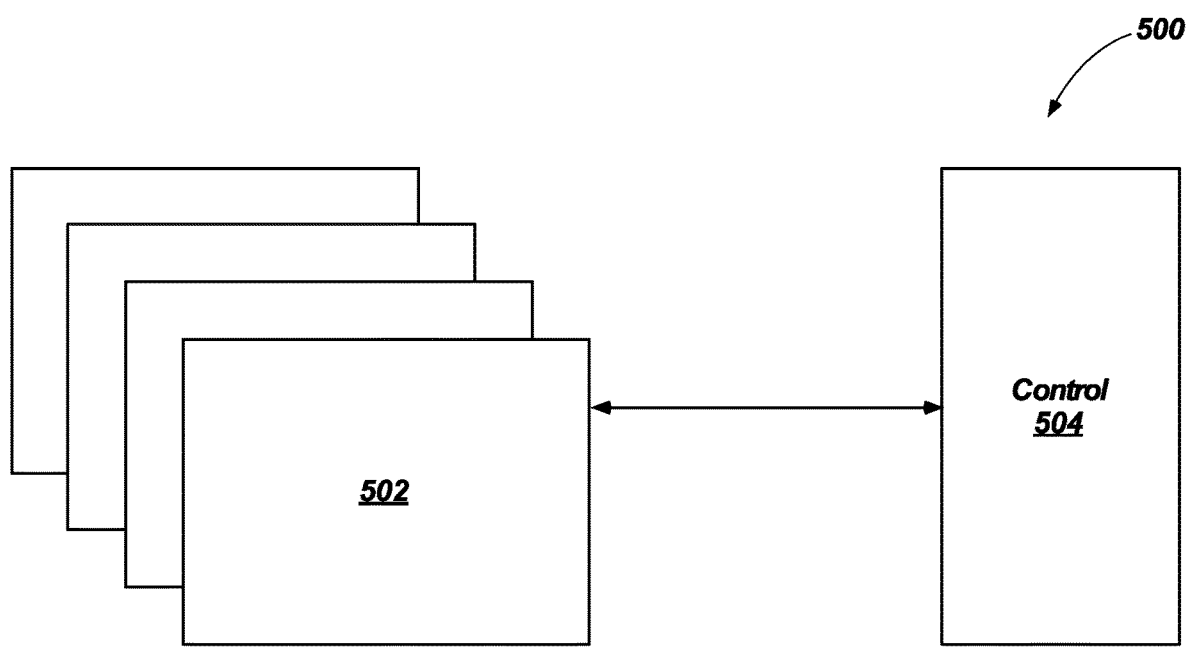
FIG. 5 is a simplified block diagram of a semiconductor device, in accordance with various embodiments of the present disclosure.

FIG. 5 is a simplified block diagram of a memory system 500 implemented according to one or more embodiments described herein. Memory system 500 includes a memory module including a number of memory devices 502 and a control logic component 504. For example, memory devices 502 may include memory devices 102-105 of FIG. 1, and/or memory device 350 and/or memory device 352 of FIG. 3B and control logic component 504 may include controller 112 of FIG. 1. Control logic component 504 may be operatively coupled with the memory devices 502 so as to read, write, or re-fresh any or all memory cells within memory devices 502.

Figure 6:
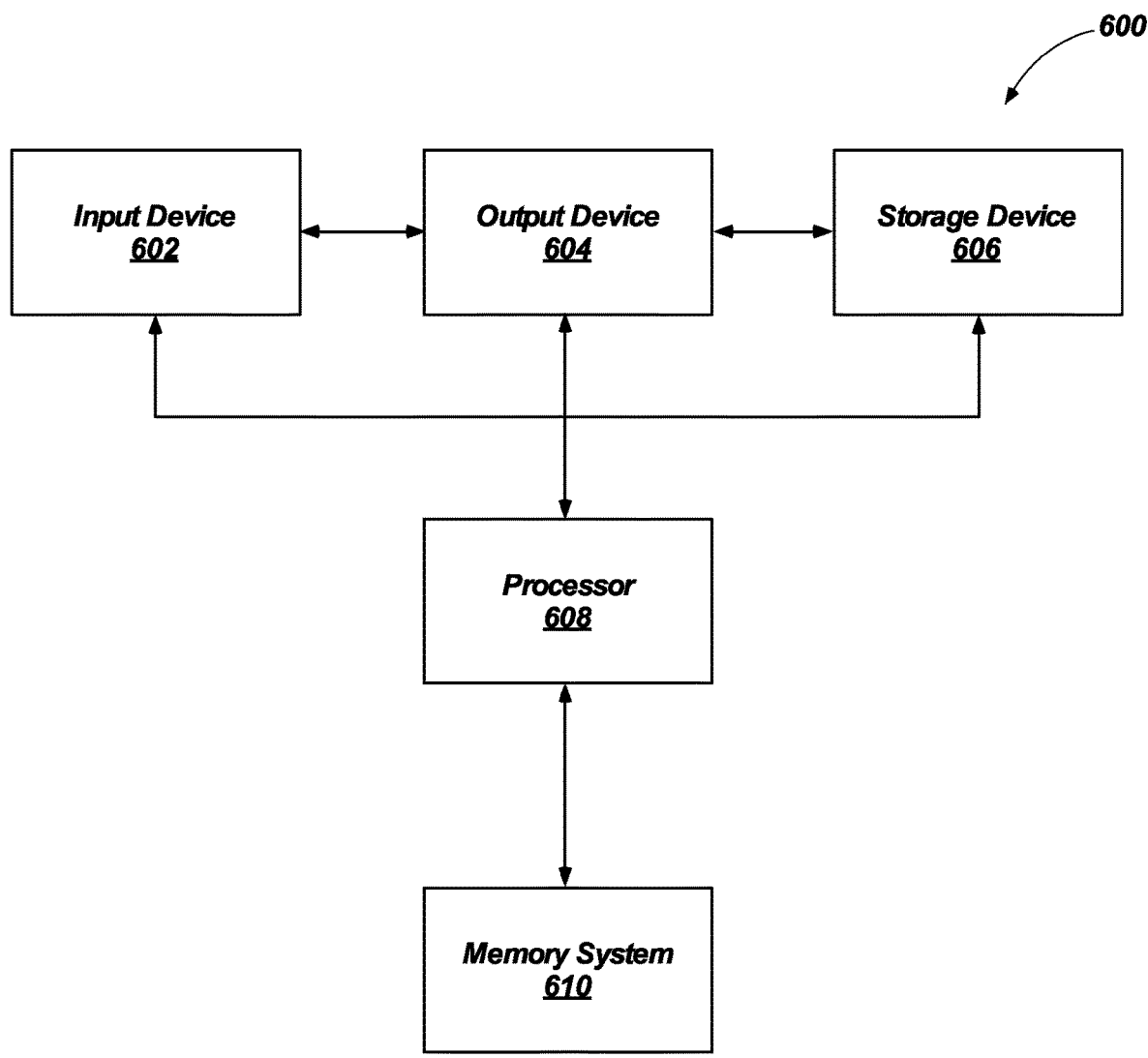
FIG. 6 is a simplified block diagram of an electronic system, in accordance with various embodiments of the present disclosure.

An electronic system is also disclosed. The electronic system may include memory system including a number of memory devices. FIG. 6 is a simplified block diagram of an electronic system 600 implemented according to one or more embodiments described herein. Electronic system 600 includes at least one input device 602. Input device 602 may be a keyboard, a mouse, or a touch screen. Electronic system 600 further includes at least one output device 604. Output device 604 may be a monitor, touch screen, or speaker. Input device 602 and output device 604 are not necessarily separable from one another. Electronic system 600 further includes a storage device 606. Input device 602, output device 604, and storage device 606 are coupled to a processor 608.

Electronic system 600 further includes a memory system 610 coupled to processor 608. Memory system 610, which may include memory system 100 of FIG. 1 or memory system 500 of FIG. 5, includes a number of memory devices (e.g., memory device 102-105 of FIG. 1). Electronic system 600 may be include a computing, processing, industrial, or consumer product. For example, without limitation, electronic system 600 may include a personal computer or computer hardware component, a server or other networking hardware component, a handheld device, a tablet computer, an electronic notebook, a camera, a phone, a music player, a wireless device, a display, a chip set, a game, a vehicle, or other known systems.

According to various embodiments disclosed herein, and in contrast to some conventional methods, systems, and devices, data signals are routed along different layers of a memory module (e.g., a DIMM). As a result, reference changes for data signals are reduced. Accordingly, signal performance of the data signals is enhanced.

One or more embodiments of the present disclosure include an apparatus. The apparatus may include a printed circuit board (PCB) comprising a number of layers, a number of memory chips, and a circuitry coupled to the number of memory chips via one or more of the number of layers. The circuitry may be configured transmit a first set of data signals associated with a memory access on a first signal layer of printed circuit board (PCB) to or from one of the number of memory chips. The circuitry may be configured to transmit a second set of data signals associated with the memory access on a second signal layer of the PCB to or from another one of the number of memory chips.

One or more embodiments of the present disclosure include an electronic system. The electronic system may include an input device, an output device, a processing device coupled to the input device and the output device, and a memory system coupled to the processing device. The memory system may include a first rank of memory chips, a second rank of memory chips, and circuitry coupled to the number of memory chips. The circuitry may be configured to transmit a first set of first data signals and a second set of the first data signals to or from the first rank of memory chips without requiring more than one reference change for the first set of the first data signals and the second set of the first data signals. The circuitry may be configured to transmit a first set of second data signals and a second set of the second data signals to or from the second rank of memory chips without requiring more than one reference change for the first set of the second data signals and the second set of the second data signals.

One or more embodiments of the present disclosure include a method. The method may include transmitting a first set of data signals associated with a memory access on a first signal layer of a printed circuit board (PCB) of a dual-rank dual in-line memory module (DIMM) to or from a first memory device of the dual-rank DIMM. The method may also include transmitting a second set of data signals associated with the memory access on a second signal layer of the PCB of the dual-rank DIMM to or from the first memory device of the dual-rank DIMM.

In accordance with common practice, the various features illustrated in the drawings may not be drawn to scale. The illustrations presented in the present disclosure are not meant to be actual views of any particular apparatus (e.g., device, system, etc.) or method, but are merely idealized representations that are employed to describe various embodiments of the disclosure. Accordingly, the dimensions of the various features may be arbitrarily expanded or reduced for clarity. In addition, some of the drawings may be simplified for clarity. Thus, the drawings may not depict all of the components of a given apparatus (e.g., device) or all operations of a particular method.

Terms used herein and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. As used herein, "and/or" includes any and all combinations of one or more of the associated listed items.

In addition, even if a specific number of an introduced claim recitation is explicitly recited, it is understood that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C," or "one or more of A, B, and C, etc.," is used, in general such a construction is intended to include A alone, B alone, C alone, A and B together, A and C together, B and C together, or A, B, and C together, etc. For example, the use of the term "and/or" is intended to be construed in this manner.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

Additionally, the use of the terms "first," "second," "third," etc., are not necessarily used herein to connote a specific order or number of elements. Generally, the terms "first," "second," "third," etc., are used to distinguish between different elements as generic identifiers. Absence a showing that the terms "first," "second," "third," etc., connote a specific order, these terms should not be understood to connote a specific order. Furthermore, absence a showing that the terms "first," "second," "third," etc., connote a specific number of elements, these terms should not be understood to connote a specific number of elements.

The embodiments of the disclosure described above and illustrated in the accompanying drawings do not limit the scope of the disclosure, which is encompassed by the scope of the appended claims and their legal equivalents. Any equivalent embodiments are within the scope of this disclosure. Indeed, various modifications of the disclosure, in addition to those shown and described herein, such as alternative useful combinations of the elements described, will become apparent to those skilled in the art from the description. Such modifications and embodiments also fall within the scope of the appended claims and equivalents.

What is claimed is:

1. A method comprising:
    transmitting a first set of data signals associated with a memory access operation on a first signal layer of a printed circuit board (PCB) of a dual-rank dual in-line memory module (DIMM) to or from a first memory device of the dual-rank DIMM; and
    transmitting a second set of data signals associated with the memory access operation on a second signal layer of the PCB of the dual-rank DIMM to or from the first memory device of the dual-rank DIMM, each of the first set of data signals and the second set of data signals including data to be either read from or written to a memory array of the first memory device during the memory access operation.

2. The method of claim 1, wherein transmitting a first set of data signals on a first signal layer comprises transmitting the first set of data signals on a signal layer within two layers of a top layer of the PCB.

3. The method of claim 1, wherein transmitting a second set of data signals on a second signal layer comprises transmitting the second set of data signals on a signal layer within two layers of a bottom layer of the PCB.

4. The method of claim 1, further comprising:
    transmitting the first set of data signals on the first signal layer to the first memory device with reference to a first ground plane adjacent to a top layer of the PCB; and
    transmitting the second set of data signals on the second signal layer to the first memory device with reference to a second ground plane that is adjacent to a bottom layer of the PCB.

5. The method of claim 1, further comprising:
    transmitting even DQ bits of a byte of data on the first signal layer; and
    transmitting odd DQ bits of the byte of data on the second signal layer.

6. The method of claim 1, wherein the transmitting of the second set of data signals is concurrent with the transmitting of the first set of data signals.

7. An apparatus, comprising:
    a printed circuit board (PCB) comprising a number of layers;
    a number of memory chips; and
    a circuitry coupled to the number of memory chips via one or more of the number of layers, the circuitry configured to:
        transmit a first set of data signals associated with a memory access operation on a first signal layer of printed circuit board (PCB) to or from a memory chip of the number of memory chips; and
        transmit a second set of data signals associated with the memory access operation on a second signal layer of the PCB to or from the memory chip of the number of memory chips, each of the first set of data signals and the second set of data signals including data to be either read from or written to a memory array of the memory chip during the memory access operation.

8. The apparatus of claim 7, wherein the first signal layer is within two layers of a top layer of the PCB.

9. The apparatus of claim 7, wherein the first signal layer is a third layer of the PCB.

10. The apparatus of claim 7, wherein the second signal layer is within two layers of a bottom layer of the PCB.

11. The apparatus of claim 7, wherein the second signal layer is a tenth layer of the PCB.

12. The apparatus of claim 7, further comprising:
    a first ground layer adjacent the first signal layer, wherein the first set of data signals are referenced with respect to the first ground layer while being transmitted to the memory chip; and
    a second ground layer adjacent the second signal layer, wherein the second set of data signals are referenced with respect to the second ground layer while being transmitted from an input to a via coupled to the memory chip.

13. The apparatus of claim 12, wherein the first set of data signals are transmitted to the memory chip while maintaining the reference to the first ground layer, and the second set of data signals are transmitted to the memory chip with no more than a single reference change.

14. The apparatus claim 7, wherein the circuitry is further configured to:
    transmit even data bits of a byte of data on the first signal layer of a Double Data Rate 4 Synchronous Dynamic Random-Access Memory (DDR4 SDRAM) DIMM; and
    concurrently transmit even data bits of the byte of data on the second signal layer of the DDR4 SDRAM DIMM.

15. An electronic system comprising:
    an input device;
    an output device;
    a processing device coupled to the input device and the output device; and a memory system coupled to the processing device, the memory system comprising:
  a first rank of memory chips;
  a second rank of memory chips; and
  a circuitry coupled to the first rank and second rank of memory chips, the circuitry configured to:
    transmit a first set of first data signals for a first memory access operation and a second set of the first data signals for the first memory access operation to or from the first rank of memory chips without requiring more than one reference change for the first set of the first data signals and the second set of the first data signals, each of the first set of first data signals and the second set of the first data signals including data to be either read from or written to a memory array of the first rank of memory chips during the first memory access operation; and
    transmit a first set of second data signals for a second memory access operation and a second set of the second data signals for the second memory access operation to or from the second rank of memory chips without requiring more than one reference change for the first set of the second data signals and the second set of the second data signals, each of the first set of second data signals and the second set of second data signals including data to be either read from or written to a memory array of the second rank of memory chips during the second memory access operation.

16. The electronic system of claim 15, wherein the circuitry is further configured to:
  transmit the first set of the first data signals on a first signal layer of a printed circuitry board (PCB) of a dual-rank in-line memory module (DIMM); and
  concurrently transmit the second set of the second data signals on a second signal layer of the PCB of the DIMM.

17. The electronic system of claim 16, wherein the circuitry is further configured to:
  transmit the first set of the second data signals on the first signal layer of the PCB of the DIMM; and
  concurrently transmit the second set of the second data signals on the second signal layer of the PCB of the DIMM.

18. The electronic system of claim 15, wherein the first set of the first data signals are even data bits of a first nibble of data and the second set of the first data signals are odd data bits of the first nibble of data.

19. The electronic system of claim 18, wherein the first set of the second data signals are even data bits of a second nibble of data and the second set of the second data signals are odd data bits of the second nibble of data.

20. The electronic system of claim 16, wherein the first signal layer is within two layers of a top layer of the PCB, and the second signal layer is within two layers of a bottom layer of the PCB.

* * * * *